(12) United States Patent
Park et al.

(10) Patent No.: US 12,736,878 B2
(45) Date of Patent: Sep. 15, 2026

(54) SEMICONDUCTOR PHOTORESIST COMPOSITION AND METHOD OF FORMING PATTERNS USING THE COMPOSITION

(71) Applicant: SAMSUNG ELECTRONICS CO., LTD., Suwon-si (KR)

(72) Inventors: Ji Cheol Park, Suwon-si (KR); Seonghyeon Ahn, Suwon-si (KR); Honggu Im, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 532 days.

(21) Appl. No.: 18/238,662

(22) Filed: Aug. 28, 2023

(65) Prior Publication Data

US 2024/0288771 A1 Aug. 29, 2024

(30) Foreign Application Priority Data

Feb. 17, 2023 (KR) ........................ 10-2023-0021389

(51) Int. Cl.

| | |
|---|---|
| ***G03F 7/039*** | (2006.01) |
| ***C08L 53/00*** | (2006.01) |
| ***G03F 7/004*** | (2006.01) |
| ***G03F 7/038*** | (2006.01) |
| ***H10P 76/20*** | (2026.01) |

(52) U.S. Cl.

CPC .............. *G03F 7/039* (2013.01); *C08L 53/00* (2013.01); *G03F 7/0045* (2013.01); *G03F 7/038* (2013.01); *H10P 76/202* (2026.01)

(58) Field of Classification Search

CPC ........ G03F 7/038; G03F 7/039; G03F 7/0045; C08L 53/00

See application file for complete search history.

(56) References Cited

U.S. PATENT DOCUMENTS

| | | | | |
|---|---|---|---|---|
| 8,178,287 | B2 * | 5/2012 | Chang | G03F 7/094 430/323 |
| 8,257,902 | B2 * | 9/2012 | Wang | G03F 7/2041 430/394 |
| 8,257,910 | B1 | 9/2012 | Guerrero et al. | |
| 8,715,902 | B2 * | 5/2014 | Wang | G03F 7/0392 430/396 |
| 9,051,423 | B2 * | 6/2015 | Qiu | G03F 1/48 |
| 9,261,786 | B2 | 2/2016 | Chang | |

(Continued)

FOREIGN PATENT DOCUMENTS

| | | | |
|---|---|---|---|
| CN | 110105513 | A | 8/2019 |
| JP | 3731328 | B2 | 1/2006 |

(Continued)

*Primary Examiner* — Amanda C. Walke
(74) *Attorney, Agent, or Firm* — Muir Patent Law, PLLC

(57) ABSTRACT

A semiconductor photoresist composition and a method of forming patterns, the composition includes an acid reactive polymer; a resin additive including a block copolymer; a photo acid generator; a photo-decomposable quencher; and a solvent, wherein the block copolymer includes an A-block and a B-block, a water contact angle of a polymer film consisting of the A-block is greater than about 50° and less than or equal to about 100°, and a water contact angle of a polymer film consisting of the B-block is greater than about 0° and less than or equal to about 50°.

20 Claims, 1 Drawing Sheet

(56) References Cited

U.S. PATENT DOCUMENTS

| | | | | |
|---|---|---|---|---|
| 10,678,132 | B2 * | 6/2020 | Kanda | G03F 7/2041 |
| 2008/0241746 | A1 * | 10/2008 | Fukuhara | G03F 7/2041<br>430/285.1 |
| 2015/0093704 | A1 * | 4/2015 | Osaki | G03F 7/0757<br>430/281.1 |

FOREIGN PATENT DOCUMENTS

| | | | |
|---|---|---|---|
| JP | 4328951 | B2 | 9/2009 |
| JP | 2010-002839 | A | 1/2010 |
| KR | 2019-0052985 | A | 5/2019 |

* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2023-0021389 filed in the Korean Intellectual Property Office on Feb. 17, 2023, the entire contents of which are incorporated herein by reference.

BACKGROUND

1. Field

Embodiments relate to a semiconductor photoresist composition and a method of forming patterns using the same.

2. Description of the Related Art

Semiconductor devices or liquid crystal displays may be miniaturized with the advancement of lithography technology. This miniaturization may be achieved generally by shortening a wavelength of exposure light and specifically, by using ultraviolet (UV) rays represented by g-rays and i-rays, a KrF excimer laser (about 248 nm) or an ArF excimer laser (about 193 nm). In addition, a $F_2$ excimer laser (about 157 nm) of a relatively short wavelength or EUV (extreme ultraviolet light), electron beam, X-ray, or the like, may be considered.

In particular, the far-ultraviolet or the KrF excimer laser may exhibit high light absorption, and a chemically-amplified photoresist using a polyhydroxystyrene derivative with relatively lower light absorption as a base resin may be considered.

The EUV extreme ultraviolet may be used for processing a finer dimension than about 20 nm, which could be difficult to process by the ArF lithography technology, using light of about 13.5 nm. The EUV extreme ultraviolet, of which photons have high energy of about 92 eV due to its very short wavelength, may not be reflected when a substrate is irradiated. Accordingly, the EUV extreme ultraviolet may not require a BARC (bottom anti reflection coating) used in ArF and KrF, and may use an underlayer (UL) to improve adhesion between the substrate and PR.

SUMMARY

The embodiments may be realized by providing a semiconductor photoresist composition including an acid reactive polymer; a resin additive including a block copolymer; a photo acid generator; a photo-decomposable quencher; and a solvent, wherein the block copolymer includes an A-block and a B-block, a water contact angle of a polymer film consisting of the A-block is greater than about 500 and less than or equal to about 100°, and a water contact angle of a polymer film consisting of the B-block is greater than about 0° and less than or equal to about 50°.

The embodiments may be realized by providing a method of forming patterns, the method including forming an etching subject layer on a substrate; coating the semiconductor photoresist composition according to an embodiment on the etching subject layer and subjecting the semiconductor photoresist composition to a soft baking process to form a photoresist layer; patterning the photoresist layer to form a photoresist pattern; and etching the etching subject layer using the photoresist pattern as an etching mask, wherein forming the photoresist layer further includes a phase separation to form an underlayer between the substrate and the photoresist layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
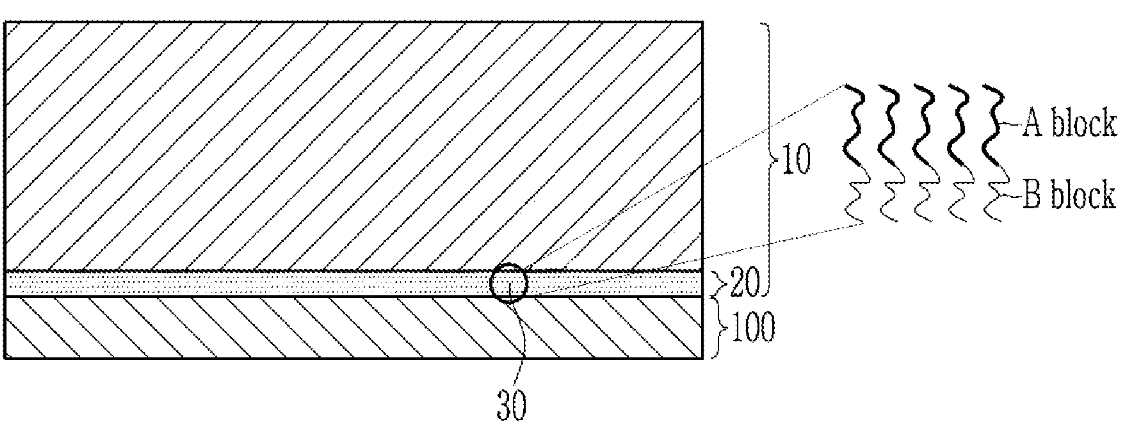
FIG. 1 is a schematic view illustrating a stage in a method of forming patterns using a semiconductor photoresist composition according to an embodiment.

As used herein, when a definition is not otherwise provided, "substituted" refers to replacement of at least one hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof. As used herein, the term "or" is not an exclusive term, e.g., "A or B" would include A, B, or A and B.

As used herein, when a definition is not otherwise provided, "hetero" refers to one including 1 to 10 heteroatoms selected from N, O, S, or P.

In addition, in the present specification, the acrylic polymer refers to an acrylic polymer and a methacrylic polymer.

Unless otherwise specified in the present specification, the weight average molecular weight is measured by dissolving a powder sample in tetrahydrofuran (THF) and then using 1200 series Gel Permeation Chromatography (GPC) of Agilent Technologies (column is Shodex Company LF-804, standard sample is Shodex company polystyrene).

In addition, unless otherwise defined in the specification, "*" indicates a linking point of a structural unit or a compound moiety of a compound.

Hereinafter, a semiconductor photoresist composition according to an embodiment is described.

A semiconductor photoresist composition according to an embodiment may include, e.g., an acid reactive polymer; a resin additive including a block copolymer; a photo acid generator (PAG); a photo-decomposable quencher (PDQ); and a solvent.

In an implementation, the block copolymer may include or be composed of, e.g., an A-block and a B-block.

In an implementation, a water contact angle of a polymer film of the A-block (e.g., a homopolymer consisting of structural units of the A-block) may be greater than about 50° and less than or equal to about 100°. In an implementation, a water contact angle of a polymer film of the B-block (e.g., a homopolymer consisting of structural units of the B-block) may be greater than about 0° and less than or equal to about 50°.

The semiconductor photoresist composition according to an embodiment may include the aforementioned block copolymer, and may form a underlayer between the substrate and the photoresist layer. In an implementation, the underlayer may have a different resin composition than that of the photoresist layer.

A method of forming the underlayer is described with reference to FIG. 1.

FIG. 1 is a schematic view illustrating a stage in a method of forming patterns using a semiconductor photoresist composition according to an embodiment.

Referring to FIG. 1, the block copolymer 30 (e.g., of the resist underlayer 20) may be phase-separated in or during the formation of the photoresist layer 10 and may be disposed perpendicularly to the substrate 100. This may result from a water contact angle difference between the A-block and the B-block in the block copolymer 30. In an implementation, the polymer film of the B-block may have a contact angle of greater than about 0° and less than or equal to about 50°, which may be positioned toward, e.g., adjacent or proximate to, the substrate. In an implementation, the block copolymer of the resin additive may self-align at the bottom of the photoresist layer 10 such that the B-block is adjacent to the substrate 100 and the A-block is adjacent to remaining portions of the photoresist layer 10 (e.g., distal to the substrate 100).

In an implementation, the polymer film of the A-block may have a contact angle of greater than about 50° and less than or equal to about 100°, and the polymer film of the A-block may have a similar polarity to that of the photoresist layer 10. In an implementation, a phase separation structure, in which the B-block is disposed or aligned toward or proximate to the substrate 100, and the A-block is disposed or aligned toward or proximate to the photoresist layer 10, may be exhibited, as shown in FIG. 1.

The water contact angle may be measured by a suitable method, e.g., a method of dripping water drops on the surface of the polymer films and measuring a contact angle of the water drops with the polymer films by using IC Measure 1.2 program.

A surface energy of the polymer film of the A-block may be, e.g., about 30 to about 50 $mJ/m^2$. A surface energy of the polymer film of the B-block may be greater than about 50 $mJ/m^2$ and less than or equal to about 80 $mJ/m^2$.

In the block copolymer, a polymerization degree of the A-block may be about 10 to about 10,000, and a polymerization degree of the B-block may be about 10 to about 10,000.

In an implementation, the composition may include, e.g., about 0.5 to about 60 wt % of the acid reactive polymer, about 0.05 to about 10 wt % of the resin additive, about 0.05 to about 10 wt % of the photo acid generator, and about 0.01 to about 5 wt % of the photo-decomposable quencher, all wt % being based on a total weight of the composition.

In an implementation, the A-block may include a structural unit represented by, e.g., Chemical Formula 1.

[Chemical Formula 1]

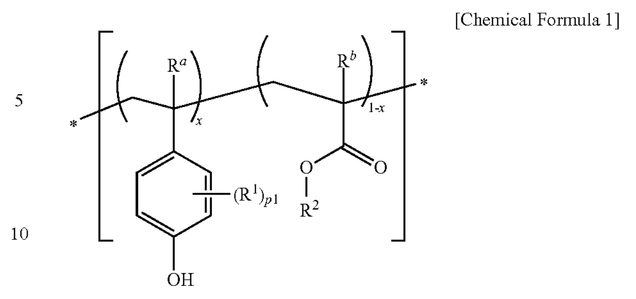

In Chemical Formula 1, $R^a$ and $R^b$ may each independently be, e.g., hydrogen or an unsubstituted methyl group.

$R^1$ may be or may include, e.g., hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof.

$R^2$ may be or may include, e.g., a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, or a substituted or unsubstituted C1 to C20 silicon alkoxy group.

x may satisfy the following relation: $0 \leq x \leq 1$.

p1 may be, e.g., an integer of 1 to 4.

The B-block may include a structural unit represented by, e.g., Chemical Formula 2.

[Chemical Formula 2]

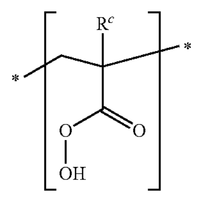

In Chemical Formula 2, $R^c$ may be, e.g., hydrogen or an unsubstituted methyl group.

In an implementation, the block copolymer may include a structural unit represented by, e.g., Chemical Formula 3.

[Chemical Formula 3]

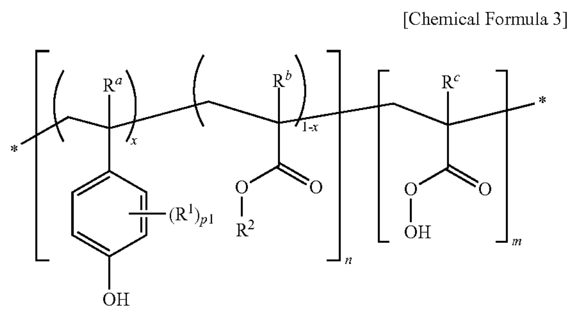

In Chemical Formula 3, $R^a$, $R^b$, and $R^c$ may each independently be, e.g., hydrogen or an unsubstituted methyl group.

$R^1$ may be or may include, e.g., hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof.

$R^2$ may be or may include, e.g., a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, and a substituted or unsubstituted C1 to C20 silicon alkoxy group, x may satisfy the following relation: $0 \leq x \leq 1$.

n and m may satisfy the following relations: $10 \leq n \leq 10{,}000$ and $10 \leq m \leq 10{,}000$, respectively.

p1 may be, e.g., an integer of 1 to 4.

Some other photoresists may use a composition and a step for forming a separate underlayer to strengthen adhesion to a lower substrate. In an implementation, in the photoresist composition according to an embodiment, the resin additive may move toward the substrate 100 during the baking (e.g., to form the resist underlayer 20), the adhesion to the substrate may be enhanced and, simultaneously, excellent sensitivity due to high solubility in a developing solution may be realized.

The composition according to an embodiment may help reduce the hassle of separately selecting and combining an underlayer optimized to each photoresist composition and thereby, achieving process economy.

In an implementation, x may satisfy the following relation: $0<x<1$.

A weight average molecular weight (Mw) of the block copolymer may be, e.g., about 5,000 to about 100,000.

The acid reactive polymer may include a structural unit represented by Chemical Formula 4 and a structural unit represented by Chemical Formula 5.

[Chemical Formula 4]

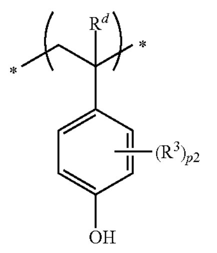

[Chemical Formula 5]

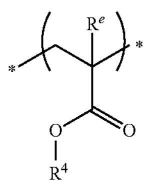

In Chemical Formulae 4 and 5, $R^d$ and $R^e$ may each independently be, e.g., hydrogen or an unsubstituted methyl group.

$R^3$ may be or may include, e.g., hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof.

$R^4$ may be or may include, e.g., a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, or a substituted or unsubstituted C1 to C20 silicon alkoxy group.

p2 may be, e.g., an integer of 1 to 4.

In an implementation, the acid reactive polymer may further include a structural unit that is different from Chemical Formula 5 and is represented by, e.g., Chemical Formula 6.

[Chemical Formula 6]

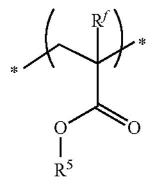

In Chemical Formula 6, $R^f$ may be, e.g., hydrogen or an unsubstituted methyl group.

$R^5$ may be or may include, e.g., a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, or a substituted or unsubstituted C1 to C20 silicon alkoxy group.

In an implementation, the acid reactive polymer may include a structural unit represented by, e.g., one of Chemical Formulae 7 to 10.

[Chemical Formula 7]

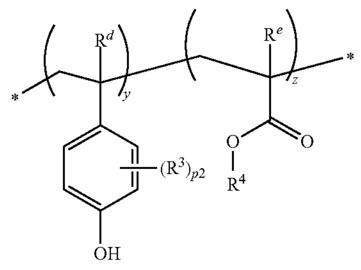

[Chemical Formula 8]

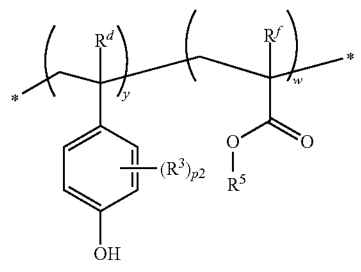

-continued

[Chemical Formula 9]

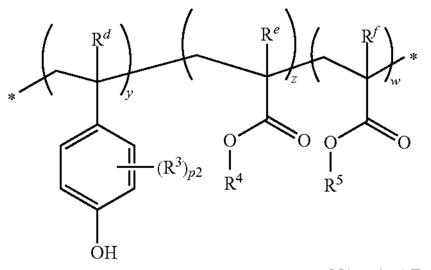

[Chemical Formula 10]

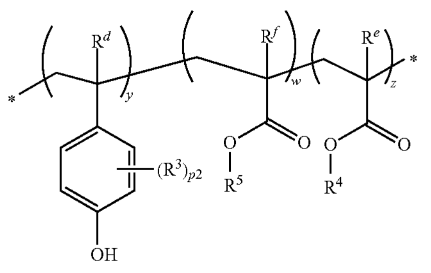

In Chemical Formulae 7 to 10, $R^d$, $R^e$, and $R^f$ may each independently be, e.g., hydrogen or an unsubstituted methyl group.

$R^3$ may be or may include, e.g., hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof.

$R^4$ and $R^5$ may each independently be or include, e.g., a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, and a substituted or unsubstituted C1 to C20 silicon alkoxy group.

p2 may be, e.g., an integer of 1 to 4.

y, z, and w may satisfy the following relations: $10 \leq y \leq 10,000$, $10 \leq z \leq 10,000$, and $10 \leq w \leq 10,000$.

A weight average molecular weight of the acid reactive polymer may be, e.g., about 5,000 to about 100,00.

In an implementation, a weight average molecular weight of the acid reactive polymer may be, e.g., about 5,000 to about 100,000, about 5,000 to about 80,000, about 5,000 to about 60,000, about 5,000 to about 40,000, or about 10,000 to about 30,000.

The resin additive including the acid reactive polymer and the block copolymer may be formed of polymers having different properties due to different types of monomers constituting each polymer. In an implementation, a mole fraction of each structural unit, a weight average molecular weight of each polymer, types of the structural unit additionally added thereto, or the like may be adjusted to change a water contact angle, surface energy, or the like. In an implementation, the resin additive may simultaneously include a moiety with high affinity for the acid reactive polymer and a moiety with affinity for the substrate according to a composition of block polymers constituting the block copolymer and thereby, may exhibit a vertical alignment. This may help realize similar characteristics as those to a case of including an underlayer.

By including a photo acid generator (PAG), the semiconductor resist composition according to an embodiment may simultaneously help improve sensitivity and resolution characteristics of the semiconductor photoresist composition without degrading either of the sensitivity and resolution characteristics.

The photo acid generator (PAG) may be a compound that produces acid by irradiation with active light or radiation.

The photo acid generator may include, e.g., a compound that that produces an organic acid upon irradiation with active light or radiation. Examples of the photo acid generator may include a sulfonium salt compound, an iodonium salt compound, a diazonium salt compound, a phosphonium salt compound, an imidesulfonate compound, an oximesulfonate compound, a diazodisulfone compound, a disulfone compound, and an o-nitrobenzylsulfonate compound.

As the photo acid generator, any of the compounds of the disclosure, alone or in a mixture thereof, may be selected and used to produce acid by irradiation with active light or radiation.

In an implementation, the photo acid generator (PAG) may include a cationic moiety (e.g., a cation) represented by Chemical Formula 5, Chemical Formula 6, or Chemical Formula 7.

[Chemical Formula 5]

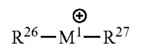

[Chemical Formula 6]

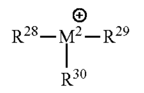

[Chemical Formula 7]

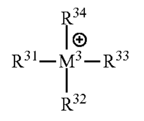

In Chemical Formulae 5 to 7, $M^1$ may be, e.g., F, Cl, Br, or I.

$M^2$ may be, e.g., O, S, Se, or The.

$M^3$ may be, e.g., N, P, As, or Sb.

$R^{26}$ to $R^{34}$ may each independently be or include, e.g., a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

In an implementation, the photo acid generator (PAG) may include a cationic moiety represented by Chemical Formula 8 or Chemical Formula 9.

[Chemical Formula 8]

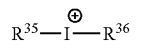

[Chemical Formula 9]

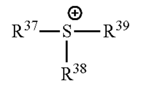

In Chemical Formulae 8 and 9, $R^{35}$ to $R^{39}$ may each independently be or include, e.g., a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

In an implementation, the semiconductor photoresist composition according to an embodiment may include the photo acid generator (PAG) in an amount of, e.g., about 0.1 wt % to about 10 wt %, about 0.3 wt % to about 10 wt %, or about 0.5 wt % to about 10 wt %. When the photo acid generator (PAG) is included in the semiconductor photoresist composition in the above content ranges, the sensitivity and resolution characteristics may be improved simultaneously without degradation of either of the sensitivity and resolution characteristics.

The photo-decomposable quencher included in the semiconductor photoresist composition according to an embodiment may play a role of trapping acid generated from the photo acid generator or the like, to help suppress a reaction of an acid-decomposable resin in the unexposed region. In an implementation, a basic compound, a basic compound whose basicity is reduced or lost by irradiating actinic rays or radiant rays, an onium salt that is relatively weak acid with respect to an acid generator, a low molecular weight compound having a nitrogen atom and a group desorbed by action of an acid, an onium salt compound having a nitrogen atom in a cation portion, or the like may be used as an acid diffusion control agent. In the composition, a suitable quencher may be appropriately used.

The photo-decomposable quencher may include, e.g., diphenyl(p-tolyl) amine, methyl diphenyl amine, triphenyl amine, phenylenediamine, naphthylamine, diaminonaphthalene, or a combination thereof.

The semiconductor photoresist composition according to an embodiment may include the photo-decomposable quencher in an amount of, e.g., about 0.01 wt % to about 5 wt %, about 0.5 wt % to about 5 wt %, or about 0.1 wt % to about 5 wt %. When the photo-decomposable quencher is included within the content ranges in the semiconductor photoresist composition, the acid generated from a photo acid generator or the like during the exposure may be effectively removed.

The solvent included in the semiconductor photoresist composition according to an embodiment may be, e.g., an organic solvent. In an implementation, the solvent may include, e.g., alkylene glycol monoalkyl ether carboxylate, alkylene glycol monoalkyl ether, alkyl lactate ester, alkyl alkoxypropionate, a cyclic lactone (e.g., having a carbon number of 4 to 10), a monoketone compound (e.g., having a carbon number of 4 to 10), alkylene carbonate, alkyl alkoxy acetate, or alkyl pyruvate. In an implementation, a mixed solvent, which is a mixture of a solvent having a hydroxyl group in the structure and a solvent not having a hydroxyl group in the structure may be used.

The solvent having the hydroxyl group and the solvent not having the hydroxyl group may be exemplary compounds described above. Examples of the solvent having the hydroxyl group may include alkylene glycol monoalkyl ether, alkyl lactate, and the like, and more specifically propylene glycol monomethyl ether (PGME), propylene glycol monoethyl ether (PGEE), methyl 2-hydroxyisobutyrate, and ethyl lactate. Examples of the solvent not having the hydroxyl group may include an alkylene glycol monoalkyl ether acetate, an alkyl alkoxy propionate, a monoketone compound which may have a ring, a cyclic lactone, or an alkyl acetate. In an implementation, the solvent may include, e.g., propylene glycol monomethyl ether acetate (PGMEA), ethyl ethoxy propionate (e.g., ethyl 3-ethoxy propionate), 2-heptanone, γ-butyrolactone, cyclohexanone, cyclopentanone, 3-methoxybutyl acetate, or butyl acetate. In an implementation, the solvent may include, e.g., propylene glycol monomethyl ether acetate, γ-butyrolactone, ethyl ethoxypropionate, cyclohexanone, cyclopentanone, or 2-heptanone. The solvent not having the hydroxyl group may include propylene carbonate or the like.

In an implementation, the solvent may include, e.g., propylene glycol monomethyl ether acetate. In an implementation, the solvent may include, e.g., propylene glycol monomethyl ether acetate as a single solvent, or a mixture of two or more including propylene glycol monomethyl ether acetate.

The solvent may be included, e.g., in a balance amount. In an implementation, the solvent may be included in an amount of, e.g., about 65 wt % to about 95 wt %, about 70 wt % to about 95 wt %, or about 75 wt % to about 95 wt % in the semiconductor photoresist composition. When included in the corresponding content ranges, it may have appropriate coating properties.

In an implementation, the semiconductor resist composition according to an embodiment may further include an additive. Examples of the additive may include a surfactant, an acid proliferator, dye, a plasticizer, a photosensitizer, a light absorber, an alkali-soluble resin, a dissolution inhibitor, a dissolution accelerator, and a combination thereof.

The surfactant may include, e.g., an alkylbenzenesulfonic acid salt, an alkyl pyridinium salt, polyethylene glycol, a quaternary ammonium salt, or a combination thereof.

An amount of the additive may be adjusted according to desired physical properties, or may be omitted.

In an implementation, the semiconductor photoresist composition may further include a silane coupling agent as an additive to help improve adhesion to a substrate (e.g., to improve adhesion of the semiconductor photoresist composition to a substrate). The silane coupling agent may include, e.g., a silane compound having a carbon-carbon unsaturated bond such as vinyltrimethoxysilane, vinyltriethoxysilane, vinyl trichlorosilane, vinyltris(β-methoxyethoxy)silane; or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl] silane, or the like.

The semiconductor photoresist composition may be advantageous for deep curing, and an LWR of the resist pattern may be improved by improving the adhesion of the resist layer to the substrate and improving the sensitivity of the resist pattern formed using the composition.

Another embodiment may provide a method of forming patterns using the aforementioned semiconductor photoresist composition. In an implementation, the prepared pattern may be a photoresist pattern.

A method of forming patterns according to an embodiment is described with reference to FIG. 1, and includes forming an etching subject layer on a substrate, coating the aforementioned semiconductor photoresist composition on the etching subject layer to form a photoresist layer, patterning the photoresist layer to form a photoresist pattern, and etching the etching subject layer using the photoresist pattern as an etching mask. In an implementation, forming the photoresist layer may include performing phase separation to form an underlayer between the substrate and the photoresist layer.

Hereinafter, a method of forming patterns using the aforementioned semiconductor photoresist composition is described with reference to FIG. 1 in comparison with the comparative method according to FIG. 2.

First, a subject for etching may be prepared. The etching subject may be a thin layer formed on a substrate 100. Hereinafter, the etching subject is described as the thin layer. A surface of the thin layer may be washed to remove impurities or the like remaining thereon. The thin layer may be, e.g., a silicon nitride layer, a polysilicon layer, or a silicon oxide layer.

Figure 2:
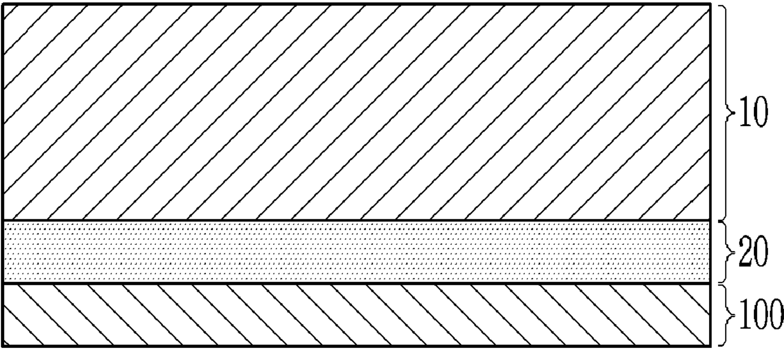
FIG. 2 is a schematic view illustrating a stage in a comparative method of forming patterns using a semiconductor photoresist composition.

Referring to FIG. 2, in the comparative method, a resist underlayer composition for forming a resist underlayer 20 may be spin-coated on the surface of the washed thin layer. Other coating methods, e.g., a spray coating, a dip coating, a knife edge coating, a printing method (e.g., an inkjet printing or a screen printing), or the like, may be used.

Then, the coated composition is dried and baked to form a resist underlayer 20 on the thin layer. The baking may be performed at about 100° C. to about 500° C., e.g., about 100° C. to about 300° C.

The resist underlayer 20 may be formed between the substrate 100 and a photoresist layer 10 and thus may help prevent non-uniformity and pattern-forming capability of a photoresist line width when a ray reflected from on the interface between the substrate 100 and the photoresist layer 10 or a hardmask between layers is scattered into an unintended photoresist region.

The photoresist layer 10 may be formed by coating the aforementioned semiconductor photoresist composition on the resist underlayer 20. The photoresist layer 10 may be obtained by coating the semiconductor resist composition on the thin layer formed on the substrate 100 and then, curing it through a heat treatment.

Referring to FIG. 1, according to an embodiment, the resist underlayer 20 may be included in the photoresist layer 10, and from the water contact angle and surface energy of the block copolymer included in the photoresist composition, the resist underlayer 20 may be formed by phase separation as each block is vertically arranged according to the affinity with the substrate and the photoresist layer.

The resist underlayer 20 may be formed after the soft baking process during the forming of the photoresist layer. In an implementation, a thickness of the underlayer may be, e.g., about 1 nm to about 100 nm.

In an implementation, forming the patterns by using the semiconductor photoresist composition may include coating the aforementioned semiconductor resist composition on the substrate 100 (having the thin layer thereon) through spin coating, slit coating, inkjet printing, or the like, and then, drying the coated semiconductor photoresist composition to form the photoresist layer 10.

The semiconductor photoresist composition has already been described in detail above.

Subsequently, a substrate 100 having the photoresist layer 10 may be subjected to a first baking process. The first baking process may be performed at about 80° C. to about 120° C.

The photoresist layer 10 may be selectively exposed.

In an implementation, the exposure may use an activation radiation with light having a high energy wavelength such as EUV (Extreme UltraViolet; a wavelength of about 13.5 nm), an E-Beam (an electron beam), or the like as well as a short wavelength such as an i-line (a wavelength of about 365 nm), a KrF excimer laser (a wavelength of about 248 nm), an ArF excimer laser (a wavelength of about 193 nm), or the like.

In an implementation, the exposure may be performed using far ultraviolet light with a wavelength range of about 100 nm to about 300 nm, e.g., a KrF excimer laser (about 248 nm), an ArF excimer laser (about 193 nm), an $F_2$ excimer laser (about 157 nm), or the like. In an implementation, the KrF excimer laser or the ArF excimer laser may be used. In an implementation, the KrF excimer laser may be used.

The resist composition according to an embodiment may be used to form a resist layer subjected to the exposure by a light source with a wavelength of about 250 nm or less.

An exposed region of the photoresist layer 10, e.g., a region not covered by the patterned hardmask may be changed due to solubility in the developing solution and thus has different solubility from that of the non-exposed region of the photoresist layer.

Subsequently, the substrate 100 may be subjected to a second baking process. The second baking process may be performed at a temperature of about 90° C. to about 200° C. The non-exposed region of the photoresist layer 10 may be insoluble with respect to a developing solution due to the second baking process.

The exposed region of the photoresist layer 10 may be dissolved and removed using the developing solution to form a photoresist pattern.

In an implementation, the developing solution may be an alkali developing solution or a developing solution including an organic solvent (hereinafter, organic developing solution).

As an alkali developing solution, a quaternary ammonium salt, typically represented by tetramethylammonium hydroxide, may be used, or other alkaline aqueous solutions such as inorganic alkali, primary to tertiary amines, alcohol amine, and cyclic amine may also be used.

The alkali developing solution may also include an appropriate amount of alcohol or surfactant. An alkali concentration of the alkali developing solution may be, e.g., about 0.1 to about 20 mass %, and a pH of the alkali developing solution may be, e.g., about 10 to about 15.

The organic developing solution may be a developing solution including an organic solvent, e.g., a ketone solvent, an ester solvent, an alcohol solvent, an amide solvent, an ether solvent, or a hydrocarbon solvent.

Examples of the ketone solvent may include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonyl acetone, ionone, diacetonyl alcohol, acetyl carbinol, acetophenone, methyl naphthyl ketone, isophorone, and propylene carbonate, and the like.

Examples of the ester solvent may include methyl acetate, butyl acetate, ethyl acetate, isopropyl acetate, pentyl acetate, isopentyl acetate, amyl acetate, propylene glycol monomethyl ether acetate, and ethylene glycol monoethyl ether acetate, ethylene glycol monobutyl ether acetate, ethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

Suitable solvents may be used as the alcohol solvent, amide solvent, ether solvent, and hydrocarbon solvent.

A plurality of the solvents may be mixed, or may be mixed with solvents or water other than the above. The developing solution may have a total moisture content of less than about 50 wt %, e.g., less than about 20 wt %, or less than about 10 wt %. In an implementation, substantially no moisture may be present.

An amount of the organic solvent of the organic developing solution may be, e.g., about 50 wt % to about 100 wt %, about 80 wt % to about 100 wt %, about 90 wt % to about 100 wt %, or about 95 wt % to about 100 wt %, based on a total weight of the organic developing solution.

In an implementation, the organic developing solution may contain an appropriate amount of a suitable surfactant.

An amount of the surfactant based on the total amount of the developing solution may be generally about 0.001 wt % to about 5 wt %, e.g., about 0.005 wt % to about 2 wt %, or about 0.01 wt % to about 0.5 wt %.

The organic developing solution may include the aforementioned quencher.

Subsequently, the photoresist pattern may be used as an etching mask to etch the resist underlayer 20. Through this etching process, an organic layer pattern may be formed. The formed organic layer pattern also may have a width corresponding to that of the photoresist pattern.

The photoresist pattern may be applied as an etching mask to etch the exposed thin layer. As a result, the thin layer may be formed with a thin layer pattern.

The etching of the thin layer may include, e.g., dry etching using an etching gas and the etching gas may include, e.g., $CHF_3$, $CF_4$, $Cl_2$, $BCl_3$, or a mixed gas thereof.

By way of summation and review, an EUV photoresist (EUV PR) may have a different water contact angle from that of a lower substrate, on which PR is coated, during the formation of the film, and adhesion of PR to the substrate could be deteriorated. In addition, EUV could generate narrow pitches, stochastic errors, and defects resulting therefrom. Accordingly, the underlayer may be appropriately selected to simultaneously help improve the adhesion and reduce the defects. As the pitches are reduced, an underlayer may not be universally used for all EUV PRs, and each EUV PR may use an optimal underlayer to maximize PR performance.

One or more embodiments may provide a semiconductor photoresist composition in which an underlayer may be further formed between a substrate and a photoresist layer by phase separation of a resin additive included in the semiconductor photoresist composition.

One or more embodiments may provide a semiconductor photoresist composition that may simultaneously realize enhanced adhesion to a substrate and defect improvement, as well as obtain a resist pattern with excellent sensitivity, resolution, and developability.

The semiconductor photoresist composition according to an embodiment may impart an underlayer function to the photoresist itself, and when the semiconductor photoresist composition including a resin additive including a block copolymer according to the embodiment is used for an EUV PR, a portion of the block copolymer may be under the PR due to generation of a vertical phase separation in the film, resulting in strengthening the adhesion to the substrate. In an implementation, there may be the same effect of having an underlayer without a separate composition for forming the underlayer or an additional process of forming the underlayer, improving performance of EUV PR.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor photoresist composition, comprising:

an acid reactive polymer;

a resin additive including a block copolymer;

a photo acid generator;

a photo-decomposable quencher; and a solvent, wherein:

the block copolymer includes an A-block and a B-block, a water contact angle of a polymer film consisting of the A-block is greater than about 50° and less than or equal to about 100°, and a water contact angle of a polymer film consisting of the B-block is greater than about 0° and less than or equal to about 50°.

2. The semiconductor photoresist composition as claimed in claim 1, wherein:

a surface energy of the polymer film consisting of the A-block is about 30 to about 50 mJ/m$^2$, and a surface energy of the polymer film consisting of the B-block is greater than about 50 mJ/m$^2$ and less than or equal to about 80 mJ/m$^2$.

3. The semiconductor photoresist composition as claimed in claim 1, wherein, in the block copolymer:

a polymerization degree of the A-block is about 10 to about 10,000, and a polymerization degree of the B-block is about 10 to about 10,000.

4. The semiconductor photoresist composition as claimed in claim 1, wherein the composition includes:

about 0.5 to about 60 wt % of the acid reactive polymer, about 0.05 to about 10 wt % of the resin additive, about 0.05 to about 10 wt % of the photo acid generator, and about 0.01 to about 5 wt % of the photo-decomposable quencher, all wt % being based on a total weight of the semiconductor photoresist composition.

5. The semiconductor photoresist composition as claimed in claim 1, wherein:

the A-block includes a structural unit represented by Chemical Formula 1:

[Chemical Formula 1]

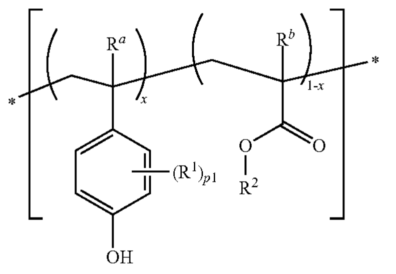

in Chemical Formula 1, $R^a$ and $R^b$ are each independently hydrogen or an unsubstituted methyl group, $R^1$ is hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof, $R^2$ is a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, or a substituted or unsubstituted C1 to C20 silicon alkoxy group, $0 \leq x \leq 1$, p1 is an integer of 1 to 4, and

* is a linking point.

6. The semiconductor photoresist composition as claimed in claim 1, wherein:

the B-block includes a structural unit represented by Chemical Formula 2:

[Chemical Formula 2]

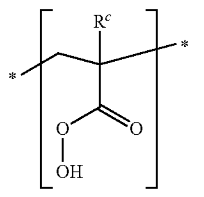

in Chemical Formula 2, $R^c$ is hydrogen or an unsubstituted methyl group, and

* is a linking point.

7. The semiconductor photoresist composition as claimed in claim 1, wherein:

the block copolymer is represented by Chemical Formula 3:

[Chemical Formula 3]

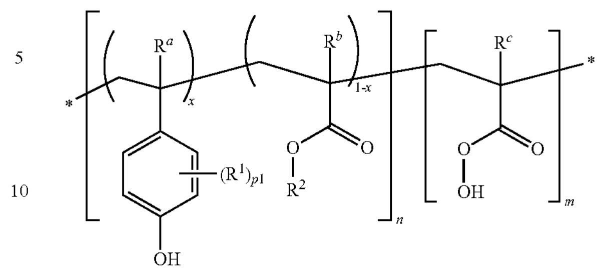

in Chemical Formula 3, $R^a$, $R^b$, and $R^c$ are each independently hydrogen or an unsubstituted methyl group, $R^1$ is hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof, $R^2$ is a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, and a substituted or unsubstituted C1 to C20 silicon alkoxy group, $0 \leq x \leq 1$, $10 \leq n \leq 10{,}000$, and $10 \leq m \leq 10{,}000$, p1 is an integer of 1 to 4, and

* is a linking point.

8. The semiconductor photoresist composition as claimed in claim 1, wherein a weight average molecular weight of the block copolymer is about 5,000 to about 100,000.

9. The semiconductor photoresist composition as claimed in claim 1, wherein:

the acid reactive polymer includes a structural unit represented by Chemical Formula 4 and a structural unit represented by Chemical Formula 5:

[Chemical Formula 4]

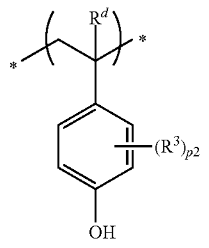

[Chemical Formula 5]

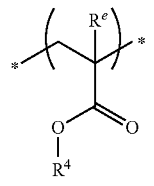

in Chemical Formulae 4 and 5, $R^d$ and $R^e$ are each independently hydrogen or an unsubstituted methyl group, $R^3$ is hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof, $R^4$ is a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, or a substituted or unsubstituted C1 to C20 silicon alkoxy group, p2 is an integer 1 to 4, and

* is a linking point.

10. The semiconductor photoresist composition as claimed in claim 9, wherein:

the acid reactive polymer further includes a structural unit represented by Chemical Formula 6, the structural unit represented by Chemical Formula 6 being different from the structural unit represented by Chemical Formula 5:

[Chemical Formula 6]

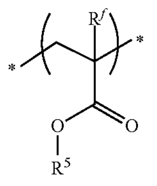

in Chemical Formula 6, $R^f$ is hydrogen or an unsubstituted methyl group, and $R^5$ is a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, or a substituted or unsubstituted C1 to C20 silicon alkoxy group.

11. The semiconductor photoresist composition as claimed in claim 1, wherein the acid reactive polymer includes a structural unit represented by one of Chemical Formulae 7 to 10:

[Chemical Formula 7]

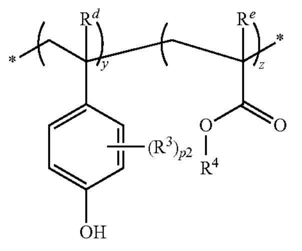

-continued

[Chemical Formula 8]

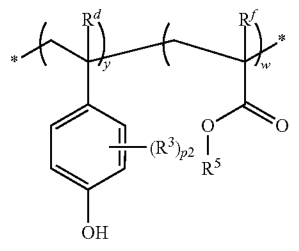

[Chemical Formula 9]

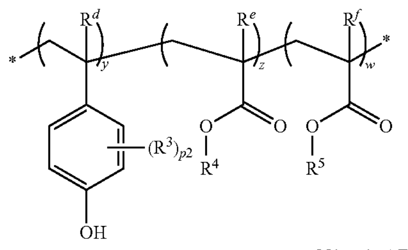

[Chemical Formula 10]

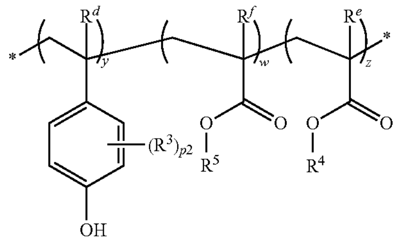

in Chemical Formulae 7 to 10, $R^d$, $R^e$, and $R^f$ are each independently hydrogen or an unsubstituted methyl group, $R^3$ is hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C6 to C20 aryl group, or a combination thereof, $R^4$ and $R^5$ are each independently a substituted or unsubstituted acetal group, a substituted or unsubstituted 2-tetrahydropyranyl group, a substituted or unsubstituted vinyl ether group, a substituted or unsubstituted 2-tetrahydrofuranyl group, a substituted or unsubstituted 2,3-propylenecarbonate group, a substituted or unsubstituted methoxy ethoxy ethyl group acetoxy ethoxy ethyl group, a substituted or unsubstituted C1 to C20 alkyl group, a substituted or unsubstituted C1 to C20 alkyl silicon group, and a substituted or unsubstituted C1 to C20 silicon alkoxy group, p2 is an integer of 1 to 4, $10 \leq y \leq 10,000$, $10 \leq z \leq 10,000$, and $10 \leq w \leq 10,000$, and

* is a linking point.

12. The semiconductor photoresist composition as claimed in claim 1, wherein a weight average molecular weight of the acid reactive polymer is about 5,000 to about 100,00.

13. The semiconductor photoresist composition as claimed in claim 1, wherein the photo acid generator includes a cationic moiety represented by Chemical Formula 11, Chemical Formula 12, or Chemical Formula 13:

[Chemical Formula 11]

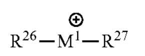

[Chemical Formula 12]

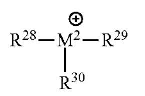

[Chemical Formula 13]

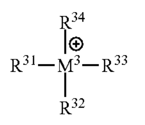

in Chemical Formulas 11 to 13, $M^1$ is F, Cl, Br, or I, $M^2$ is O, S, Se, or Te, $M^3$ is N, P, As, or Sb, and $R^{26}$ to $R^{34}$ are each independently a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

14. The semiconductor photoresist composition as claimed in claim 1, wherein the photo acid generator includes a cationic moiety represented by Chemical Formula 14 or 15:

[Chemical Formula 14]

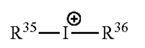

[Chemical Formula 15]

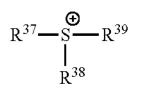

in Chemical Formulas 14 and 15, $R^{35}$ to $R^{39}$ are each independently a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

15. The semiconductor photoresist composition as claimed in claim 1, wherein the photo-decomposable quencher includes diphenyl(p-tolyl) amine, methyl diphenyl amine, triphenyl amine, phenylenediamine, naphthylamine, diaminonaphthalene, or a combination thereof.

16. The semiconductor photoresist composition as claimed in claim 1, further comprising a surfactant, an acid proliferator, dye, a plasticizer, a photosensitizer, a light absorber, an alkali-soluble resin, a dissolution inhibitor, a dissolution accelerator, or a combination thereof.

17. A method of forming patterns, the method comprising:

forming an etching subject layer on a substrate;

coating the semiconductor photoresist composition as claimed in claim 1 on the etching subject layer and subjecting the semiconductor photoresist composition to a soft baking process to form a photoresist layer;

patterning the photoresist layer to form a photoresist pattern; and etching the etching subject layer using the photoresist pattern as an etching mask, wherein forming the photoresist layer further includes a phase separation to form an underlayer between the substrate and the photoresist layer.

18. The method as claimed in claim 17, wherein the underlayer is formed after the soft baking process during the forming of the photoresist layer.

19. The method as claimed in claim 17, wherein a thickness of the underlayer is about 1 nm to about 100 nm.

20. The method as claimed in claim 17, wherein forming the photoresist pattern includes performing an exposure using light having a wavelength of about 100 nm to about 300 nm.

* * * * *